(12) United States Patent
Bergström

(10) Patent No.: US 11,076,490 B2
(45) Date of Patent: Jul. 27, 2021

(54) METHOD AND DEVICE FOR APPLYING SOLDER PASTE FLUX

(71) Applicant: MYCRONIC AB, Taby (SE)

(72) Inventor: Johan Bergström, Bromma (SE)

(73) Assignee: MYCRONIC AB, Taby (SE)

( * ) Notice: Subject to any disclaimer, the term of this patent is extended or adjusted under 35 U.S.C. 154(b) by 640 days.

(21) Appl. No.: 15/509,838

(22) PCT Filed: Sep. 7, 2015

(86) PCT No.: PCT/EP2015/001794
§ 371 (c)(1),
(2) Date: Mar. 8, 2017

(87) PCT Pub. No.: WO2016/037694
PCT Pub. Date: Mar. 17, 2016

(65) Prior Publication Data
US 2017/0257951 A1    Sep. 7, 2017

(30) Foreign Application Priority Data
Sep. 9, 2014   (SE) .................................. 1400425-3

(51) Int. Cl.
*H05K 3/34* (2006.01)
*H05K 3/00* (2006.01)

(52) U.S. Cl.
CPC ................ *H05K 3/34* (2013.01); *H05K 3/00* (2013.01); *H05K 3/3489* (2013.01);
(Continued)

(58) Field of Classification Search
CPC ...... H05K 3/34; H05K 3/3489; H05K 3/3484; H05K 3/00; H05K 2201/035; H05K 2203/0126
See application file for complete search history.

(56) References Cited

U.S. PATENT DOCUMENTS 7,201,802 B2    4/2007 Holm et al.
7,600,548 B2 *  10/2009 Holm ................... B23K 3/0607
                                                         156/356
(Continued)

FOREIGN PATENT DOCUMENTS

CN    1442030 A    9/2003
EP    1308072 A1   5/2003
(Continued)

OTHER PUBLICATIONS

PCT Application No. PCT/EP2015/001794 International Search Report and Written Opinion, dated Mar. 1, 2016, 11 pages.
(Continued)

*Primary Examiner* — Livius R. Cazan
(74) *Attorney, Agent, or Firm* — Haynes Beffel & Wolfeld LLP; Ernest J. Beffel, Jr.

(57) ABSTRACT

A method of applying viscous media on a substrate is disclosed. In the method, the substrate is provided, which is arranged for mounting of electronic components thereon. Further, flux is provided on a deposit of solder paste, which deposit is arranged at a predetermined position on the substrate. The flux is provided by a non-contact dispensing process, such as jetting. By providing flux on the deposit prior to reflow, the risk of quality related issues, such as e.g. graping, advantageously is reduced.

22 Claims, 6 Drawing Sheets

(52) U.S. Cl.
CPC ..... *H05K 3/3485* (2020.08); *H05K 2201/035* (2013.01); *H05K 2203/0126* (2013.01)

(56) References Cited

U.S. PATENT DOCUMENTS

| | | |
|---|---|---|
| 7,757,391 B2 | 7/2010 | Holm et al. |
| 7,931,933 B2 | 4/2011 | Holm et al. |
| 2007/0090170 A1 | 4/2007 | Anderson et al. |
| 2008/0156895 A1 | 7/2008 | Mellody et al. |

FOREIGN PATENT DOCUMENTS

| | | | |
|---|---|---|---|
| JP | 10290066 A | * | 10/1998 |
| WO | 1999/64167 A1 | | 12/1999 |
| WO | 2002/05607 A1 | | 1/2002 |
| WO | 2002/05608 A1 | | 1/2002 |

OTHER PUBLICATIONS

PCT Application No. PCT/EP2015/001794 International Preliminary Report on Patentability, dated Jan. 9, 2017, 16 pages.
CN201580056733.x—Office Action dated Nov. 1, 2018, 7 pages.

* cited by examiner

METHOD AND DEVICE FOR APPLYING SOLDER PASTE FLUX

CROSS-REFERENCE

This application is the U.S. National Stage of International Application No. PCT/EP2015/001794 filed 7 Sep. 2015, which claims priority to Swedish Application No. 1400425-3, filed 9 Sep. 2014. Where an element of this international application referred to in Article 11(1)(iii)(d) or (e) or a part of the description, claims or drawings referred to in Rule 20.5(a) is not otherwise contained in this but is completely contained in the priority international application, that element or part is incorporated by reference in the international application for the purposes of Rule 20.6. The identified Priority and International Applications are hereby incorporated by reference.

TECHNICAL FIELD

The present invention relates to application of viscous medium on a substrate, and in particular application of flux on a deposit of solder paste by means of a non-contact dispensing method.

BACKGROUND

Viscous media, such as solder paste, may be used for connecting electronic components to substrates such as printed circuit boards (PCBs). Solder paste is typically applied to the substrate in predetermined volumes, or deposits, to which connection points or leads of the electronic components may be attached for electrical connection and mechanical support. The solder paste is typically also applied to the substrate at predetermined positions, e.g. by screen printing or according to a jet printing job prepared in advance.

The solder paste may comprise powdered metal solder suspended in a flux to form a viscous medium, suppress oxidation and to facilitate reflow, wherein the metal particles coalesce into a solder joint. Conventionally, the deposits may be formed on the PCB prior to mounting the electronic components. The deposits may e.g. be provided by means of screen printing, contact dispensing or jetting of droplets of the solder paste (or other viscous media such as e.g. glue) onto the PCB. The electronic components may be mounted or placed onto the surface of the PCB such that they are at least temporarily attached or fastened to the solder paste deposits. The PCB may then be subjected to heat such that the solder of the deposits is reflowed, forms the solder joints and provides mechanical support and/or electrical connection of the electronic components.

Today, there is a growing interest in smaller electronic components and more densely packed PCB assemblies. This miniaturization process increases the need for smaller deposit volumes, since a surplus of solder paste may lead to short-circuiting or bridging of the electronic components.

U.S. Pat. No. 7,757,391 B2 addresses this issue by adding predetermined additional amounts of solder paste on predetermined positions on a screen printed substrate. The additional solder paste is provided by jetting, which e.g. allows for the solder paste to be applied in patterns that are not possible to achieve through screen printing and in dots or deposits that are smaller than what can be achieved when using conventional dispensing or screen printing.

Although different methods for applying viscous media on a substrate are known, there is still a need for an improved method of applying relatively small deposits resulting in solder joints of improved quality.

SUMMARY

It would be advantageous to provide a solution that allows for an improved quality of the solder joints of relatively small electrical components, such as e.g. 01005 component packages. In particular, it would be desirable to achieve a method of applying viscous medium on a substrate such that the risk for oxidised and not fully or at least poorly reflowed solder joints is reduced.

To better address one or more of these concerns, a method and an apparatus having the features defined in the independent claims are provided. Preferable embodiments are defined in the dependent claims.

Hence, according to an aspect, a method of applying viscous medium on a substrate is provided. The method comprises a step of providing the substrate for mounting of electronic components thereon, and a step of providing flux on a deposit of solder paste which is typically arranged at a predetermined position on the substrate. The flux is provided by a non-contact dispensing process, such as e.g. a jetting process.

According to certain aspects, a method is provided that comprises a step of applying viscous medium in form of additional flux on deposits of solder paste already arranged/provided at certain positions on a substrate. As mentioned more in detail below, the deposits of solder paste already include flux and the additional flux is provided onto at least one of the deposits of solder paste by a non-contact dispensing process, such as e.g. a jetting process. The non-contact dispensing process proposed is an advantageous process over a contact dispensing process for the specific application of the invention of providing additional flux on deposits of solder paste, in that the non-contact feature of the invention reduces the risk of the deposits of solder paste being distorted and/or removed from their positions on the substrate. This is more prone to happen during a contact dispensing process as a result of the deposits adhering to the flux, and that the flux during a contact dispensing process is not capable to efficiently enough being released from the dispensing tip.

For the purpose of this application, a solder paste is essentially powdered metal solder suspended in a thick medium called flux. Flux is added to act as a temporary adhesive, holding the components until the soldering process melts the solder and makes a stronger physical connection. The paste is a gray, putty-like material. The composition of the solder paste varies, depending upon its intended use. Generally, the size and shape of the metal particles in the solder paste determines how well the paste will "print".

A solder ball is typically spherical in shape as the spherical shape helps in reducing surface oxidation and ensures good joint formation with the adjoining particles. Irregular particle sizes are typically not used, as they tend to clog. To produce a quality solder joint, it is often very important for the spheres of metal to be very regular in size and have a low level of oxidation. Further For the purpose of this application, the term "substrate" should be interpreted as a printed circuit board (PCB), a substrate for ball grid arrays (BGA), chips scale packages (CSP), quad flat packages (QFP), and flip-chips or the like. It is also noted that the term "jetting" should be interpreted as a non-contact dispensing process that utilises a fluid jet to form and shoot droplets of a viscous medium from a jet nozzle onto a substrate, e.g. as described in the published International Application WO 99/64167, as compared to a contact dispensing process, such as "fluid wetting", which is the act of the viscous medium leaving the dispense tip, contacting and clinging to the substrate and remaining on the substrate as the dispense tip pulls away.

Jet printing technology provides the ability to jet solder paste or surface mount adhesives at high frequencies while moving over a substrate such as a PCB at high speed. It is a contact-free technology which is software driven. Jet printing technology is predicted to replace traditional screen printing technology in high-mix production environments.

An advanced control system is typically also used in jet printing technology to ensure that every dot has the desired volume and is ejected at the right time with the optimal exit velocity. This may be achieved by a well balanced interplay between a feeding mechanism, such as e.g. a screw pump, and an actuator, such as e.g. a piezoelectric actuator. An advanced motion control system is often used in jet printing technology to ensure that the right paste volume is fed through the feeding mechanism, that the positioning accuracy is correct and that the dot sizes can be achieved at the very high pace of the piezo actuator while travelling over the PCB at full speed. To achieve not only correct positioning but typically also the shortest possible production time, the path over the PCB is often pre-compiled. Thus, the jet printing process may be highly repeatable and predictable, the travel time is known prior to running a jet printing job and will be the same every time. The servo system will then follow the same trajectory for each individual board and the result will be identical.

Jet printing is often completely software driven and there is typically no need for stencils or time consuming operator intervention when setting up a new printing job. A new jet printing job is often programmed offline and sent automatically to the machine. A data preparation tool may be used to create jet printing programs with zero or very few errors. Programs may be fine-tuned off-line, verified and ready to run—before the first board enters the line. Once in the machine, a barcode on the solder paste cartridge and ID chip in the cassette may be used to ensure that the right type of paste is used for the right batch. Each and every solder joint on a board can be optimized with respect to at least one of solder paste volume, position, height, shape and pad coverage.

The strive for miniaturization of electronic devices, which e.g. is manifested in the nascent use of 01005 component packages, leads to an increased demand for smaller deposit volumes. As an example, a 010055 component package may have a length of 0.4 mm and a width of 0.2 mm and require deposit volumes of a few nanolitres ($1 \cdot 10^{-9}$ of a litre). For such low deposit volumes the prior art solutions for applying and reflowing the solder paste may be insufficient due to particular surface effects, i.e. effects caused by the relatively large surface-to-volume ratio. As the volume decreases, the amount of flux per unit area of the deposit may be reduced accordingly. Further, the flux may desiccate or evaporate prior to reflow, or too fast during reflow. The flux may also flow out as its viscosity decreases during the heating and thereby expose the top of the deposits. A lack or insufficient amount of flux during reflow may give rise to unreflowed solder particles and/or dry joints. These types of defects, marked by the appearance of unreflowed solder particles in or on the joints, may be referred to as "graping".

Thus, the present invention is based on the advantageous idea of using a non-contact dispensing process for the application of additional flux onto a deposit of solder paste.

Providing flux on a deposit of solder paste prior to reflow is associated with several advantages. Firstly, the additional amount of flux reduces the risk for a shortage or lack of solder paste during reflow, which otherwise may lead to dry joints and graping. Secondly, the additional flux may act as an adhesive and/or increase or improve the stickiness of the deposit, which advantageously may help holding the mounted components in place up to reflow. This may also be referred to as tackiness, which indicates the strength of adhesion that the solder paste, or the deposit, exhibits in order to hold an electronic component in place. Further, the additional flux may prevent the flux of the solder paste from drying up, or, in other words, increase the tack time of the solder paste. Tack time corresponds to the length of time that a solder paste, or deposit, can stay tacky enough to hold a component in position. Thirdly, the setup of the reflow process, such as the thermal profile of the oven, may be facilitated since the risk of consuming or evaporating the flux too fast is reduced by the additional amount of flux. As an example, a relatively high peak temperature and/or a relatively longer time above liquidus (TAL) may be used without risking to negatively affect the quality of the solder joint. Further, the use of non-contact dispensing, such as jetting, is advantageous in that the added flux is not simultaneously in contact with both the nozzle and the deposit during the application and hence the risk of the deposit being affected by the application process of the flux is reduced. In a contact dispensing process, there is a risk that the deposit adheres to the flux during the dispensing process, and that the flux is not capable to efficiently enough being released from the dispensing tip. Thus, the non-contact dispensing advantageously reduces the risk of the deposit clinging on the flux, following the dispensing tip, being distorted and/or being moved from its predetermined position on the substrate. Also, jetting is advantageous to conventional dispensing in that it may be faster, more accurate and more flexible. In fact, when comparing jetting with conventional dispensing, the latter often provide a bottle neck that increases the cycle time in the overall component mounting process.

Providing (additional) flux on the deposit is also advantageous in that the total amount of flux of the deposit can be increased without diluting the solder paste, i.e. without increasing the flux concentration of the solder paste that is to be provided on the substrate. Increasing the flux content of the solder paste prior to application on the substrate may adversely affect the quality of the deposit, such as its spreading or height to width ratio, its shape, and the volume of the resulting solder joint. Adding the flux in a separate, non-contact dispensing step, thus allows for a maintained or improved quality of the deposit.

Certain aspects of the technology disclosed propose a method and device for providing a "cover" of flux on top of at least one deposit of solder paste in order to partly or fully cover the entire at least one deposit prior to reflow so that at least a part of the additional amount of flux of the "cover" evaporates prior to reflow and/or is consumed during reflow instead of part of the flux of the solder paste, thus allows for a maintained or improved quality of the at least one deposit of solder paste. This important characteristic of the method and technology disclosed is in particular important for low solder paste deposit volumes of a few nanolitres or less as the flux in these small deposits of solder paste otherwise may desiccate or evaporate prior to reflow, or too fast during reflow, and where a lack or insufficient amount of flux during reflow may give rise to unreflowed solder particles and/or dry joints.

According to a particular embodiment of the technology disclosed, at least a part of the flux is provided on at least a part of an electronic component already attached to the deposit. The component may in other words have been mounted on the substrate prior to application of the flux. The electronic component may be provided on the substrate prior to the method according to the present embodiment is performed. It will however be realized that the mounting of the electronic component may form part of the present method. It will also be realized that the mounting of the electronic component may also be part of the same system or component mounting production line as the non-contact dispensing process. Further, the flux may be provided on that part of the component that is attached to the deposit, or be at least partly provided the remaining portions of the component. The flux may also partly or fully cover the entire component.

The deposit may be deformed during the mounting of the electronic component which may be attached to the deposit by means of an applied force. It may therefore be advantageous to provide the flux after the mounting such that the flux may be more evenly distributed over the (deformed) solder paste deposit. In this embodiment, the flux may be provided in a separate processing step that is subsequent to the mounting of the electronic component. The flux may e.g. be provided by a downstream non-contact dispensing device where the deposits of solder paste are provided by screen printing or jet printing, or be provided by the same non-contact dispensing device printing the deposits of solder paste. The single non-contact dispensing device may then comprise both a first jet printing head and a second non-contact dispensing head which is not a jet printing head.

Certain aspects of the particular embodiment of providing the additional flux on at least a part of an electronic component already attached to the deposit propose a method and device for providing a "cover" of flux on top of the component to partly or fully cover the entire attached component prior to reflow so that at least a part of the additional amount of flux of the "cover" evaporates prior to reflow and/or is consumed during reflow instead of part of the flux of the deposit solder paste onto which the component is attached, thus allows for a maintained or improved quality of the deposit of solder paste onto which the component is attached. This important characteristic of the method and technology disclosed is in particular important for low solder paste deposit volumes of a few nanolitres or less as the flux in these small deposits of solder paste otherwise may desiccate or evaporate prior to reflow, or too fast during reflow, and where a lack or insufficient amount of flux during reflow may give rise to unreflowed solder particles and/or dry joints.

According to an embodiment of the technology disclosed, the method comprises attaching an electronic component to the deposit after providing the flux on the deposit. Since the flux may improve the tackiness of the deposit, i.e. increase tack time and/or tack force of the deposit, adhesion of the component to the deposit may be improved or facilitated. An increased tack time may hence allow for a longer period of time between the providing of the solder paste and/or flux and the mounting of the component, which advantageously may facilitate handling and assemblage of the substrates.

According to an embodiment, the deposit of solder paste is a screen-printed deposit. The deposit may e.g. be screen-printed prior to the method according to the present embodiment is performed, or form part of the present method. The deposit may e.g. be screen-printed in a separate screen-printer arranged upstream of a non-contact dispensing device providing the flux. The screen-printer and the non-contact dispensing device may however be integrated or combined into a common device.

According to an embodiment, the deposit of solder paste is a non-contact dispensed deposit of solder paste. The deposit may e.g. be provided on the substrate prior to the method according to the present embodiment is performed, or form part of the present method. The solder paste may e.g. be provided by a first non-contact dispensing head in form of a jetting head assembly and the additional flux deposit by a second non-contact dispensing head assembly. The first and second non-contact head assemblies may e.g. form part of separate, subsequently arranged jetting or non-contact dispensing devices, or be arranged in or form part of a combined or single or non-contact dispensing or jetting device. In case the first and second jetting or non-contact dispensing head assemblies (e.g. one jetting head assembly for providing the solder paste and one non-contact dispensing head for providing the additional amounts of flux) are arranged in or form part of a combined jetting device, the first and second non-contact dispensing head assemblies may act in parallel or in sequence.

It will however be realized that the forming of the deposit of solder paste may be comprised in the method according to the present aspect of the invention. In such case, the method comprises forming the deposit by adding a predetermined amount of solder paste at the predetermined position on the substrate, e.g. by screen-printing, non-contact dispensing or by a combination of both. Preferably, a single jetting device performs both the forming of the solder paste deposit and the providing of the flux, which decreases the physical complexity of the overall component mounting process. Alternatively, this is performed by a separate jetting device.

In case the forming of the deposit is not included in the method, said method may use a substrate comprising one or several previously formed deposits, which e.g. has been formed by means of screen-printing or non-contact dispensing or a combination of both.

According to an embodiment, the amount of flux provided on the deposit is based on a volume of the deposit. A larger amount of flux may e.g. be added to larger deposits, i.e. deposits having a larger volume or deposits having a larger area, as compared to the amount of flux added to smaller deposits or deposits having a smaller volume or smaller area. The amount of flux may e.g. be measured as a total volume provided on the deposit, or as a thickness of a layer of flux provided on or covering the deposit. The volume of the deposit may e.g. be determined by the amount of solder paste required for forming the deposit, a desired volume of the deposit, or by the results of an inspection of the deposit, such as e.g. optical or mechanical measurements of the deposit. Providing an amount of flux based on a volume of the deposit advantageously reduces the risk for a lack or shortage of flux.

According to an embodiment, the method comprises inspecting the deposit prior to providing the flux, estimating a volume of the deposit based on the inspection, and, in response to the estimated value being below a threshold value, providing flux on the deposit. The inspection can be performed on the deposit already provided on the substrate, between the forming of the deposit of solder paste and the providing of the flux, and/or after the flux has been provided. Estimating the volume of the deposit allows for smaller deposits, i.e. deposits having a volume below a particular threshold value, to be identified and provided with flux so as to reduce the risk of graping and other defects that may adversely affect the quality of the resulting solder joints. Larger deposits, i.e. deposits having a volume being equal to or exceeding the threshold value, may not be as sensitive to volume-related defects as the smaller deposits. By providing flux only on the relatively small deposits, the total flux consumption may hence be reduced.

If the inspection is performed after the flux is provided on the deposit, errors in the application of flux can be detected and corrected in a further step of providing flux. Errors such as insufficient amounts of flux or missing flux can thereby be corrected and the quality of the resulting solder joint hence improved.

The inspection may also be performed in order to detect errors or defects of the solder paste deposits. An error or defect may e.g. relate to missing deposits, missing amounts of solder paste or irregular shape of the deposits. At least some of the errors may, based on the inspection, be corrected by adding, such as jetting, additional solder paste onto the substrate. This means that any additional amount of solder paste that is determined to be required as a result of errors in the regular solder paste application may be added in the correction.

According to certain aspects of the technology disclosed and the claims, the inspection may be performed by an automatic paste-on-pad verification system that utilizes a non-contact dispenser's (e.g. jet printer's) at least one sensor or downward looking camera to rapidly scan the entire board, individual deposits, or a programmable subset of components. As jet printing is a software driven and non-contact technology, a jet printing system can further be configured to inspect the deposits of solder paste and then optionally use the result of the inspection, e.g. 2D inspection, performed by the at least one sensor or downward looking camera to manually or automatically generate or create a non-contact dispensing job, such as a jet printing job.

The job created may subsequently be used for providing/printing additional amounts of flux on certain (predetermined) positions on the substrate, e.g. on those, by the sensor or camera, identified sub-range of positions on the substrate arranged/provided with deposits of solder paste having small amounts of solder paste and flux, e.g. estimated amounts of solder paste below a certain pre-determined threshold. Based on the result of the inspection of the deposits of solder paste already arranged/provided on the substrate, the printing job for providing the additional amount of flux may also be programmed offline and sent automatically to the non-contact dispensing machine. A data preparation tool may also be used to create a printing program with zero or very few errors.

According to an embodiment, an evaluation may be performed to determine whether the number or the severity of detected errors in the forming of the deposits and/or the providing of the flux are such that correction is worthwhile. If a large number of corrective actions are required, then it might be more economical to simply discard the substrate. This is of course dependent on the type of substrate and the cost involved for the substrate. If correction is not deemed worthwhile, the substrate is preferably cleaned from any applied viscous medium and reused. On the other hand, if cleaning the substrate is not considered economical, the substrate is preferably discarded.

According to a further aspect, a jetting device for applying viscous medium on a substrate is provided. The jetting device comprises at least one non-contact dispensing head assembly such as e.g. a jetting head assembly configured to provide flux on a deposit of solder paste, wherein the deposit is arranged at a predetermined position on the substrate.

In one embodiment, the jetting device comprises a first jetting head assembly configured to form the deposit of solder paste by means of jetting or non-contact dispensing, and a second non-contact dispensing head assembly configured to provide flux on the jetted deposit. The flux may e.g. cover a part of the deposit, or, more preferably fully cover the deposit.

In one embodiment, the jetting device is configured to provide at least some flux on at least a part of an electronic component attached to the deposit. In case the jetting device comprises a first jetting head for forming the deposits and a second non-contact head assembly such as e.g. a jetting head for adding the flux to the deposits, the electronic components may be mounted to the substrate by a separate component mounting device before the flux is added. It will however be appreciated that a component mounting device or tool may be incorporated or associated with the jetting machine so as to facilitate and reduce the physical complexity of the overall component mounting process.

In one embodiment, the jetting device comprises an inspection means that is configured to inspect the provided viscous media, i.e. the deposit of solder paste and/or the jetted flux. The inspection means may e.g. comprise an optical inspection tool adapted to measure a volume, height, width and/or shape of the deposit. Further, the inspection means may be configured to detect presence of and/or evaluate the quality of the added flux. These measures can be e.g. be evaluated or compared with reference values so as to determined whether the provided viscous medium is defect or missing, and to determine whether correction is needed.

It is noted that embodiments of the inventions relates to all possible combinations of features recited in the claims. Further, it will be appreciated that the various embodiments described for the method according to the first aspect are all combinable with embodiments of the device as defined in accordance with the second aspect.

Certain aspects of the technology disclosed provides for a method of applying viscous media on a substrate, the method comprising the actions of:

providing a substrate arranged for mounting of electronic components thereon; and providing additional amounts of flux on a plurality of (small) deposits of solder paste already arranged/placed at predetermined positions on the substrate, wherein the provision of the additional amounts of flux on the plurality of (small) deposits of solder paste is performed in order to reduce the risk for a shortage or lack of solder paste during reflow which may lead to dry joints and graping.

Certain aspects of the technology disclosed provides for a method of applying a plurality of deposits of viscous media on a substrate, the method comprising the actions of:

providing a substrate arranged for mounting of electronic components thereon; and providing deposits of flux on a plurality of deposits of solder paste, wherein the plurality of deposits of solder paste are already arranged/placed at predetermined positions on the substrate, and wherein the deposits of flux are provided by a non-contact dispensing process (and not a contact dispensing process) in order reduce the risk of portions of the deposits of solder paste is being distorted and/or removed from their positions on the substrate.

Certain aspects of the technology disclosed provides for a method of applying viscous media on a substrate, the method comprising the steps of:

providing a substrate arranged for mounting of electronic components thereon; and providing flux on a deposit of solder paste (including flux), which deposit is already provided at a certain position on the substrate;

wherein the flux is provided by a non-contact dispensing process, thereby reducing the risk of portions of the deposits of solder paste is being distorted and/or removed from their positions on the substrate.

Certain aspects of the technology disclosed provides for a method of applying viscous media on a substrate, the method comprising the steps of:

providing a substrate arranged for mounting of electronic components thereon;

providing solder paste deposits on the substrate;

identifying a sub-range of the solder paste deposits having low deposit volumes (e.g. below a certain threshold amount) and, accordingly, small amounts of flux; and providing additional amounts of flux on the identified portion of deposits of solder paste having low deposit volumes, wherein the additional amounts of flux is provided by a non-contact dispensing process (thereby reducing the risk of the deposits of solder paste being distorted and/or removed from their positions on the substrate) on said identified portion of the solder paste deposits having low deposit volumes, and wherein the provision of the additional amounts of flux on said identified portion of the solder paste deposits having low deposit volumes is performed in order to reduce the risk for a shortage or lack of solder paste during reflow, which otherwise may lead to dry joints and graping.

Certain aspects of the technology disclosed provides for a non-contact dispensing device such as a jetting device (e.g. comprising a combined jet printing head assembly and a non-contact dispensing head assembly) for applying viscous medium on a substrate is provided, the device comprising at least one non-contact dispensing head assembly configured to providing flux on a deposit of solder paste (thereby reducing the risk of portions of the deposits of solder paste is being distorted and/or removed from their positions on the substrate), which deposit is arranged at a predetermined position on the substrate (where the deposit of solder paste may have been printed by a/the jetting assembly head or a screen printer).

BRIEF DESCRIPTION OF THE DRAWINGS

These and other aspects will now be described in more detail with reference to the appended drawings showing embodiments.

All the figures are schematic, not necessarily to scale, and generally only show parts which are necessary in order to elucidate the embodiments, wherein other parts may be omitted or merely suggested. Like reference numerals refer to like elements throughout the description.

DETAILED DESCRIPTION

The present aspects will now be described more fully hereinafter with reference to the accompanying drawing, in which currently preferred embodiments are shown. This invention may, however, be embodied in many different forms and should not be construed as limited to the embodiments set forth herein; rather, these embodiments are provided for thoroughness and completeness, and fully convey the scope of the present aspects to the skilled person.

Figure 1:
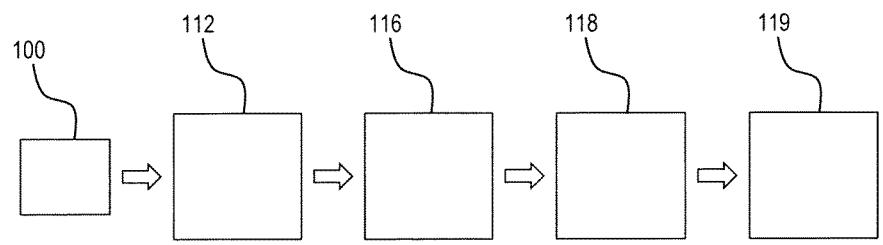
FIGS. 1-3 are block diagrams illustrating arrangements according to embodiments of the present invention.
Figure 4:
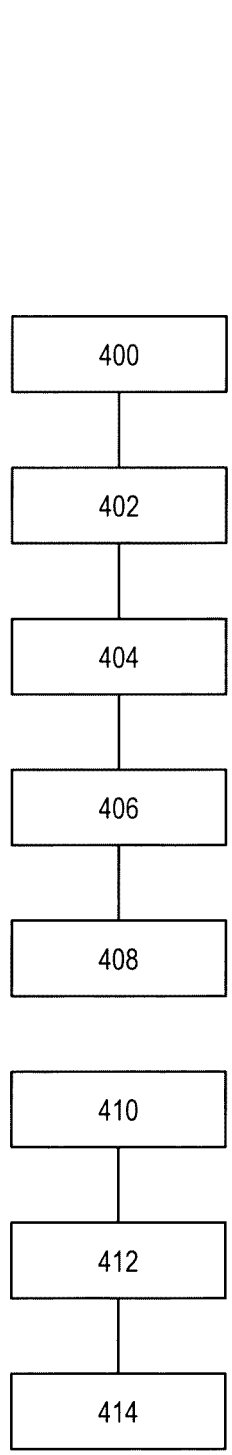
FIGS. 4-6 illustrate in flow chart form embodiments of the present invention.

Turning first to FIGS. 1 and 4, there is shown a first exemplary embodiment of the present invention. A substrate, such as a PCB 100 is transferred 400 to a jet printing device 112 for solder paste, where a plurality of deposits are formed 402 at predetermined positions of the PCB 100. Then, the PCB 100 is transferred 404 to a non-contact dispensing device 116 for flux, where predetermined amounts of flux are provided 406 on at least some of the deposits. Following the non-contact dispensing 406 of the flux, the substrate 100 is transferred 408 to a component mounting device 118, where electrical components are mounted 410 on the substrate 100. As an alternative, there may be included a step of inspecting the final results of the solder paste jetting and the non-contact dispensing of flux. After the mounting 410 of the electronic components, the substrate is transferred 412 to a reflow oven 119 where the deposits are reflowed 414 in order to form solder joints.

Figure 2:
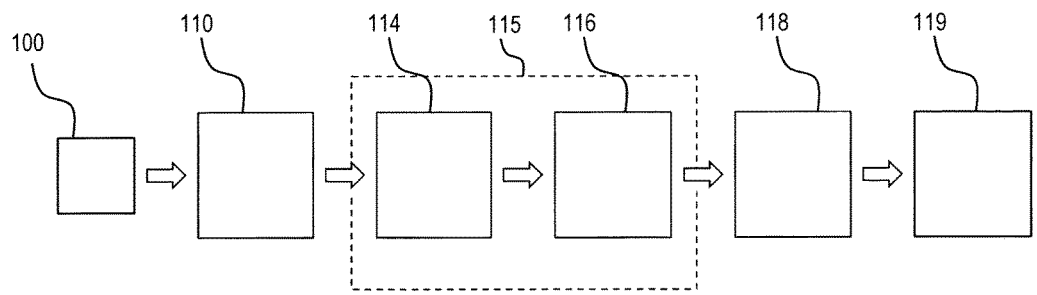
Figure 5:
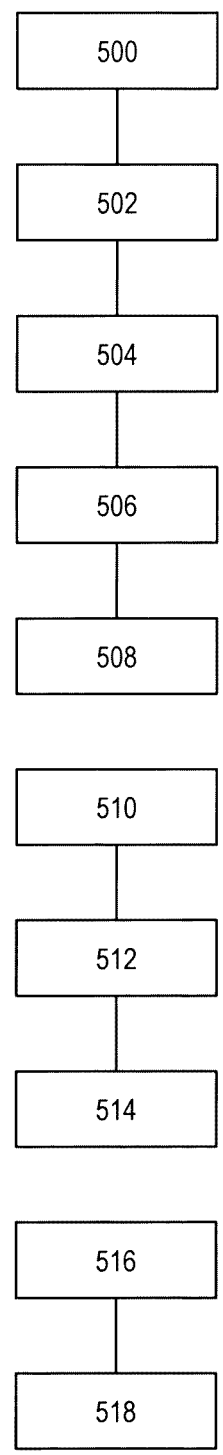

With reference now to FIGS. 2 and 5, there is shown another exemplary embodiment of the present invention. According to this embodiment, the substrate 100 is transferred 500 to a screen printer 110 which applies 502 the solder paste forming the deposits. The substrate 100 is then transferred 504 to an inspection device 114 that inspects 506 the deposits. The results of the inspection 506 is recorded and relayed to the non-contact dispensing device 116 for flux. With the information as to the results of the inspection, the non-contact dispensing device 116 for flux can perform any required non-contact dispensing 510 of flux onto deposits e.g. having a volume being below a pre-determined threshold value. Further, the non-contact dispensing device 116 for flux may comprise a jetting head assembly for solder paste, and may hence be able to correct deficiencies of the deposits by adding additional amounts of solder paste to specific deposits or locations on the substrate 100. The inspection device 114 is preferably incorporated in the same machine as the non-contact dispensing device 116 for flux, thus forming a combined inspection and jetting device 115. However, the inspection device 114 can also be a separate machine.

Following the application 510 of the flux, the substrate 100 is transferred 512 to the component mounting device 118, where the electronic components are mounted 514 by attaching them to the deposits. Finally, the substrate 100 is transferred 516 to the reflow oven 119 at which the deposits are reflowed 518.

Figure 3:
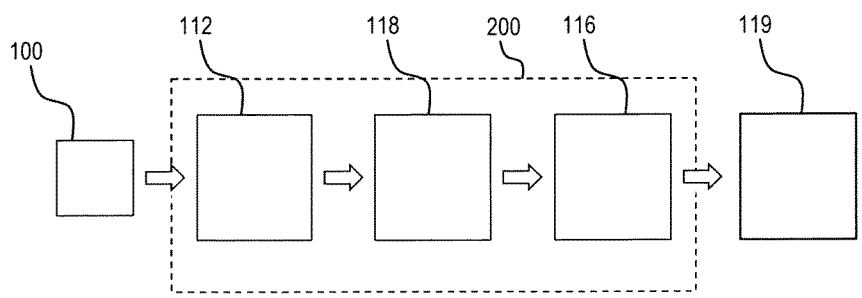
Figure 6:
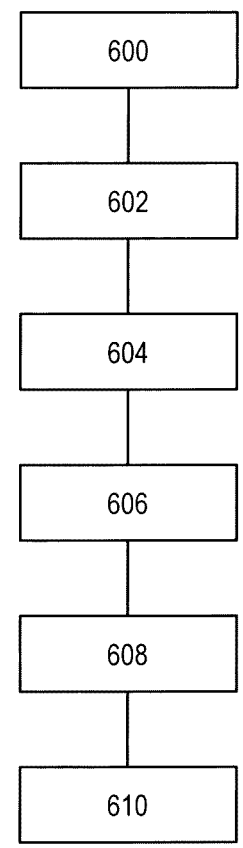

The block diagram of FIG. 3 and the flow chart of FIG. 6 illustrate yet another exemplary embodiment of the present invention. Here, the jetting device 112 for solder paste, the component mounting device 118 and the non-contact dispensing device 116 for flux are incorporated in a combined device 200. Following the transfer 600 of the substrate 100 to said device 200, deposits of solder paste are formed 602, electronic components mounted 604 and flux provided 606 on at least some of the deposits and on portions of electronic components attached to the deposits. The substrate 100 is then transferred 608 to the reflow oven for reflow 610 of the deposits.

Figure 7:
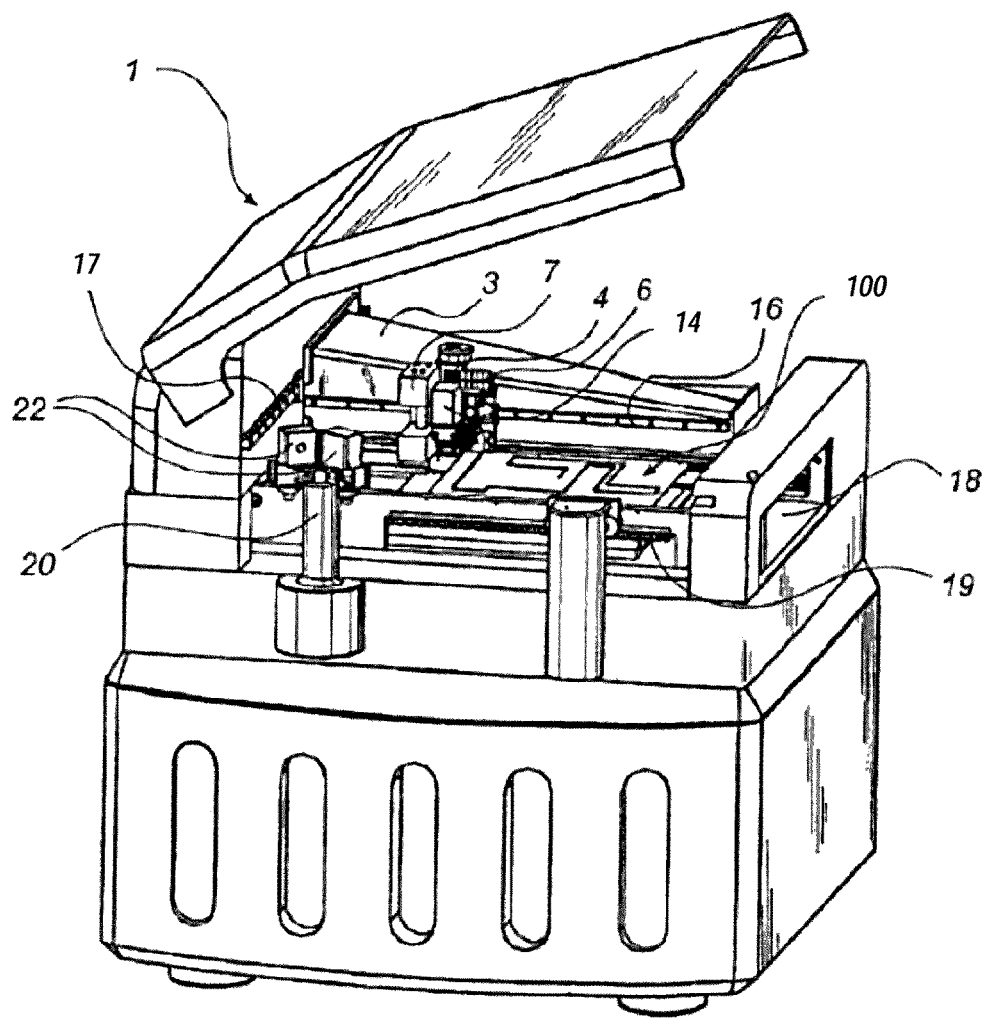
FIG. 7 is a perspective view showing a general outline of a jetting device according to an embodiment.

Referring to FIG. 7, a non-contact dispensing device such as a jetting device 1 is illustrated which includes an X-beam 3 and an X-wagon 4 connected to the X-beam 3 via an X-rail 16 and reciprocally movable along the X-rail 16. The X-beam 3 is reciprocally and movably connected to a Y-rail 17, thereby being movable in directions perpendicular to the X-rail 16. The Y-rail 17 is rigidly mounted in the machine 1. Movement of the X-wagon 4 and the X-beam 3 may be driven by linear motors (not shown).

A conveyer 18 feeds a substrate 100 through the jetting device 1. When the substrate 100 is in the appropriate position under the X-wagon 4, a locking device 19 fixes the substrate 100 in place. A camera 7 locates fiducial markers on the surface of the substrate 100 to determine the precise position of the substrate 100. Viscous medium, such as solder paste and/or flux, is applied to the substrate 100 at desired or predetermined locations by moving the X-wagon 4 over the substrate 100 in a given, desired or predetermined pattern and operating a non-contact dispensing head assembly 14 such as a jetting head assembly at given, desired or predetermined locations.

Since production speed is a relatively important factor in the manufacturing of electronic circuit boards, the application of viscous medium is typically performed "on the fly".

Figure 8:
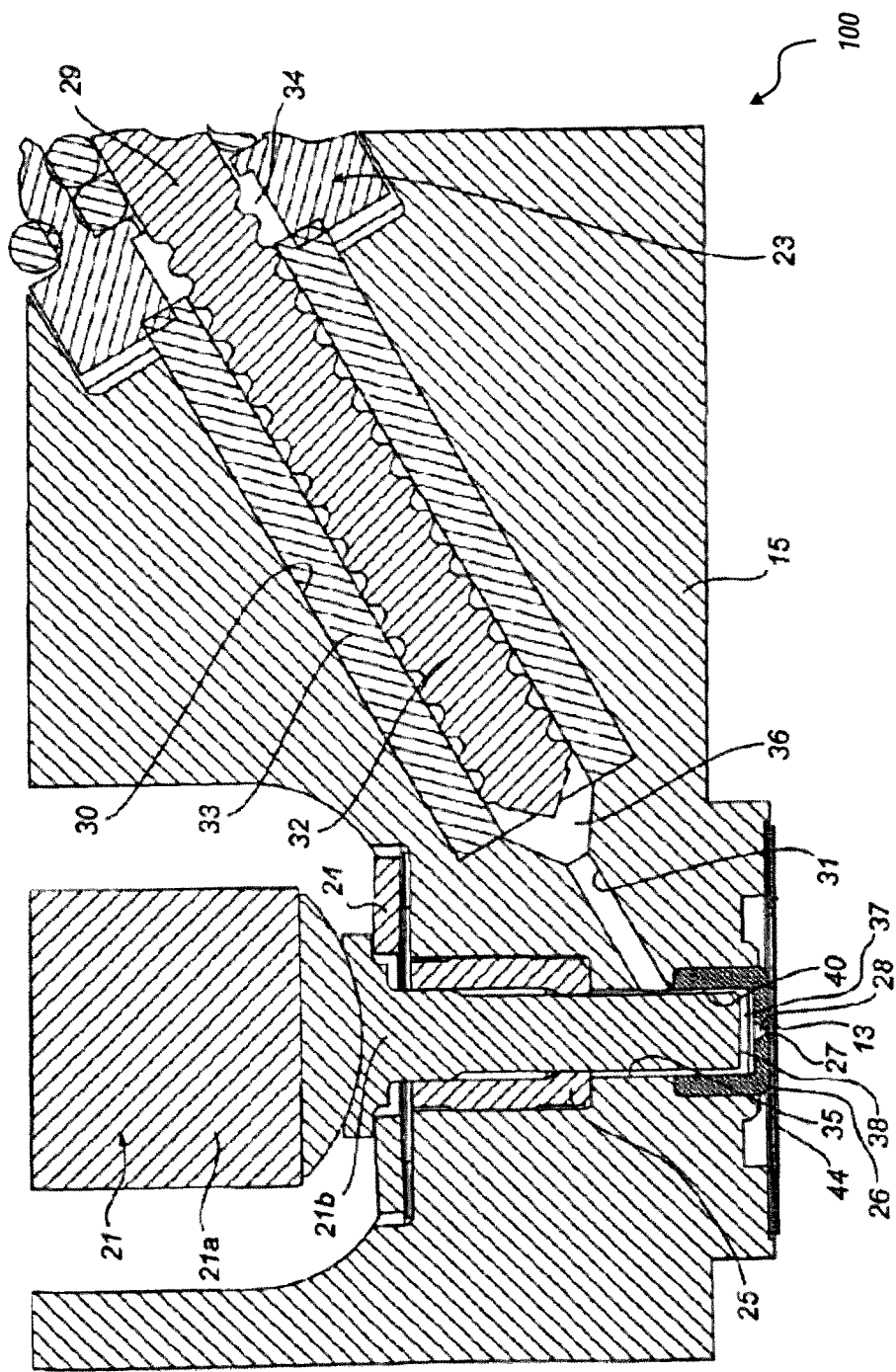
FIG. 8 is a schematic view showing a cut away portion of a jetting head assembly according to an embodiment.

FIG. 8 illustrates example contents and function of parts enclosed in the non-contact dispensing head assembly 14 as described with reference to FIG. 7. The non-contact dispensing head assembly 14 includes an impacting device, such as a piezoelectric actuator 21 having a number of relatively thin, piezoelectric elements stacked together to form an actuator part 21a. A lower end of the actuator part 21a is rigidly connected to an assembly housing 15. The jetting head assembly 14 further includes a bushing 25, rigidly connected to the assembly housing 15, and a plunger 21b which is rigidly connected to a lower end of the actuator part 21a. The plunger 21b is axially movable while slidably extending through a bore in the bushing 25. Cup springs 24 are provided to resiliently balance the plunger 21b against the assembly housing 15, and to provide a preload for the actuator part 21a. An ejection control unit (not shown) applies a drive voltage intermittently to the piezoelectric actuator 21, thereby causing an intermittent extension thereof, and hence a reciprocating movement of the plunger 21b with respect to the assembly housing 15, in accordance with pattern printing data for the deposits.

The non-contact dispensing head assembly 14 further includes a plate-shaped or substantially plate-shaped jetting nozzle 26 operatively directed against the substrate 100, onto which relatively small droplets of viscous medium, such as solder paste or flux, are to be jetted. The jetting nozzle 26 comprises a through hole which defines a nozzle space 28, through which the viscous medium is forced during the jetting process. The viscous medium may be supplied to the nozzle by means of a pump assembly comprising a rotatable feeder screw 29 and a resilient feeder shell 33.

The plunger 21b includes a piston portion which is configured to slide and axially move through a piston bore 35. An impact end surface 38 of the piston portion of the plunger 21b is arranged relatively close to the nozzle 26. A jetting chamber 37 is defined by the end surface 38 of the plunger 21b, the cylindrical inner wall of the nozzle 26, the upper surface of the nozzle 26 and the upper end of the nozzle space 28. Thus, the jetting chamber 37 is connected to the upper portion of the nozzle space 28. Axial movement of the plunger 21b towards the nozzle 26 caused by the intermittent extension of the piezoelectric actuator 21 may result in a decrease (e.g., relatively rapid decrease) in the volume of the jetting chamber 37, and thus pressurisation (e.g., a rapid pressurisation) and jetting of the viscous medium in the nozzle space 28 through the nozzle 26.

The degree of filling of the nozzle space 28 before each jetting is set in order to obtain a controlled and individually adjusted amount of viscous medium in each droplet. The degree of filling may e.g. be adjusted by the rotational speed of the feeder screw 29.

Figure 9A:
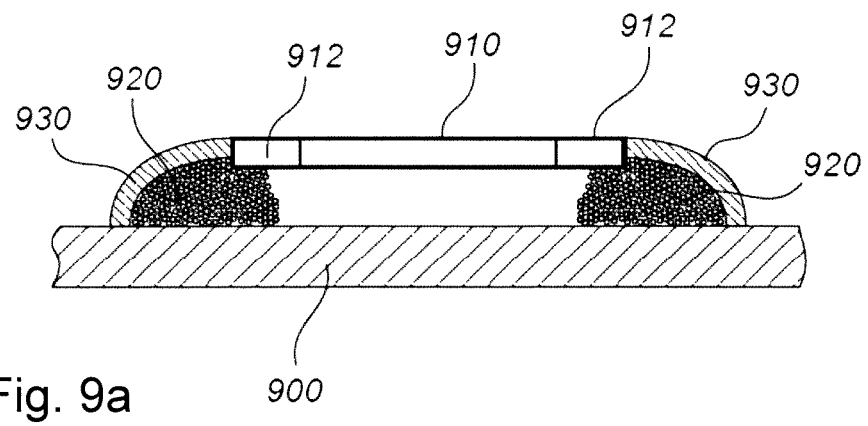
FIGS. 9a-c and 10 illustrate electronic components attached to the deposits according to embodiments of the present invention.
Figure 9B:
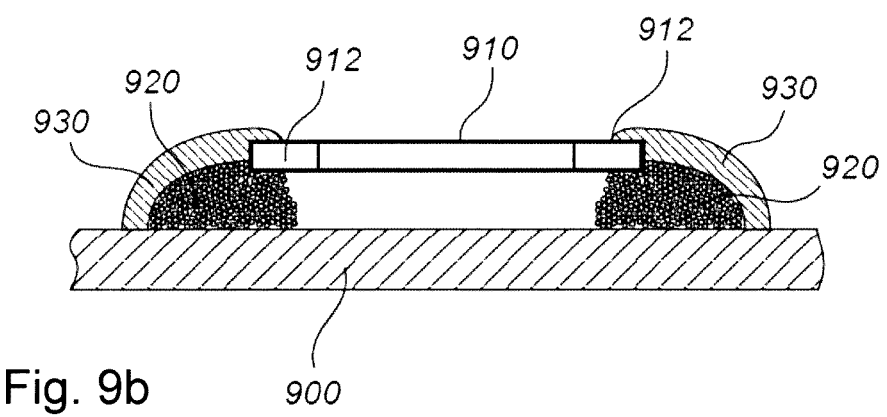
Figure 9C:
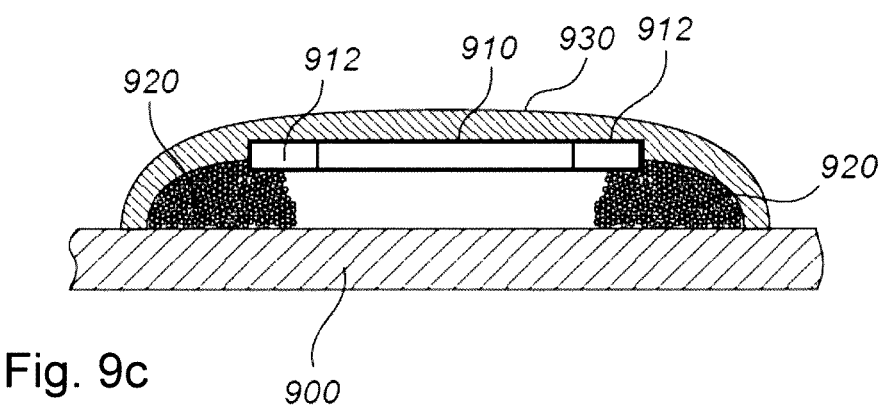

FIGS. 9a-c illustrate an electronic component 910 that is mounted on a substrate, such as a PCB 900, e.g. by means of a pick-and-place machine (not shown). The electronic component 910 may e.g. be a 01005 component, having two contacting portions 912 that are attached to a respective deposit 920 of solder paste. In FIG. 9a, flux 930 has been provided on the solder paste deposits 920 after the electronic component 910 is attached to the deposits 920. The flux 930 may e.g. be provided in a relatively thin layer covering at least a part, or preferably all of, the deposits 920. In FIG. 9b, the flux 930 has been applied not only to the deposits 920 but also to a part of the electronic component 910. In this example, the flux is provided on a portion of the contact portion 912 of the electronic component 910. In FIG. 9c, flux 930 has been provided on both the deposits 920 and the electronic component 910 such that the deposits 920 and the electronic component 910 is fully covered by a layer of flux 930.

Figure 10:
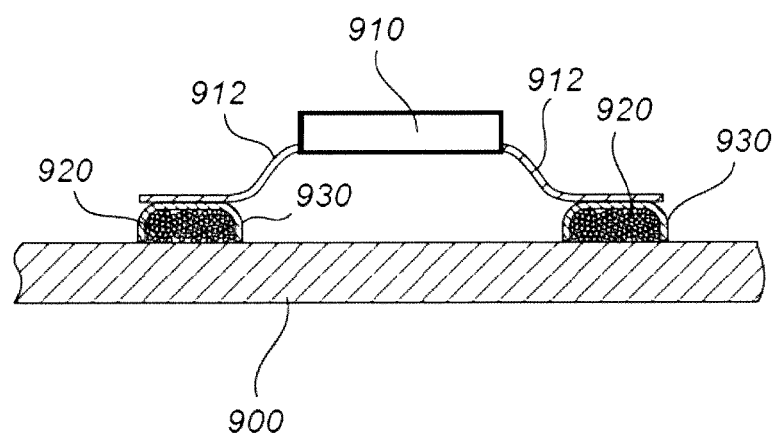

Alternatively, the electronic component 900 can be mounted after the flux 930 is provided. This is illustrated by FIG. 10, which shows an electronic component 910 wherein the contacting portions 912 are attached to deposits 920 that are covered with a layer of flux 930.

In summary, a method and device for applying viscous media on a substrate is provided, wherein flux is provided by a non-contact dispensing process on a deposit of solder paste that is arranged on a substrate onto which electronic components can be mounted.

The person skilled in the art realizes that the present invention by no means is limited to the preferred embodiments described above. On the contrary, many modifications and variations are possible within the scope of the appended claims. Additionally, variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:
1. A method of applying viscous media on a substrate, the method comprising:
arranging the substrate for mounting of electronic components thereon; and
selectively providing additional flux on at least one deposit among deposits of solder paste that comprise flux, the at least one deposit being arranged at a certain position on the substrate;
wherein the additional flux does not contain any metal particles and is provided by a non-contact dispensing process on top of the deposit in order to partly or fully cover the deposit prior to reflow;

wherein at least a part of the additional flux is provided on at least a part of an electronic component after the electronic component is attached to the deposit.

2. The method according to claim 1, wherein the deposits of solder paste are screen-printed.

3. The method according to claim 1, wherein the deposits of solder paste are non-contact dispensed.

4. The method according to claim 1, further comprising forming the deposits of solder paste by providing a predetermined amount of solder paste to a predetermined position on the substrate according to a printing job or program.

5. The method according to claim 1, wherein the selectively providing of additional flux is performed by adding a predetermined amount of flux to the certain position on the substrate, without adding additional flux to non-selected deposits of solder paste on the substrate.

6. The method according to claim 1, wherein the deposit of solder paste is formed by means of a first jetting head assembly and the additional flux is provided by means of a second non-contact dispensing head assembly, and wherein the first jetting head assembly and the second non-contact dispensing head assembly are different.

7. The method according to claim 6, wherein the first jetting head assembly and the second non-contact dispensing head assembly each forms part of a single equipment device.

8. The method according to claim 6, wherein the first jetting head assembly and the second non-contact dispensing head assembly each forms part of two separate and/or different equipment devices.

9. The method according to claim 1, further comprising heating the substrate so as to reflow the solder paste of the deposit.

10. The method according to claim 1, further comprising:
identifying a subset of the solder paste deposits containing low deposit volumes, below a certain threshold amount, and, accordingly, small amounts of flux; and
providing the additional flux on the identified subset of the solder paste deposits having low deposit volumes.

11. A method of applying viscous media on a substrate, the method comprising:
arranging the substrate for mounting of electronic components thereon; and
selectively providing additional flux on at least one deposit among deposits of solder paste that comprise flux, the at least one deposit being arranged at a certain position on the substrate;
wherein the additional flux does not contain any metal particles and is provided by a non-contact dispensing process on top of the deposit in order to partly or fully cover the deposit prior to reflow; and
wherein an amount of the additional flux provided on the deposit is based on a volume of said deposit.

12. The method according to claim 1, further comprising:
inspecting the deposit prior to providing the additional flux;
estimating a volume of the deposit based on the inspection; and
in response to the estimated volume,
providing the additional flux on the deposit.

13. The method according to claim 12, wherein the additional flux is provided based on the inspecting the deposit and in response to the estimated volume being below a threshold value.

14. The method according to claim 12, further comprising providing the additional flux by adding a predetermined amount of flux to a predetermined position according to a printing job or program created in response to the inspecting of the deposit of solder paste prior to providing the additional flux.

15. The method according to claim 11, further comprising attaching an electronic component to the deposit after providing the additional flux on said deposit.

16. The method according to claim 11, wherein the deposits of solder paste are screen-printed.

17. The method according to claim 11, wherein the deposits of solder paste are non-contact dispensed.

18. The method according to claim 11, further comprising forming the deposits of solder paste by providing a predetermined amount of solder paste to a predetermined position on the substrate according to a printing job or program.

19. The method according to claim 11, wherein the selectively providing of additional flux is performed by adding a predetermined amount of flux to the certain position on the substrate, without adding additional flux to non-selected deposits of solder paste on the substrate.

20. The method according to claim 11, wherein the deposit of solder paste is formed by means of a first jetting head assembly and the additional flux is provided by means of a second non-contact dispensing head assembly, and wherein the first jetting head assembly and the second non-contact dispensing head assembly are different.

21. The method according to claim 20, wherein the first jetting head assembly and the second non-contact dispensing head assembly each forms part of a single equipment device.

22. The method according to claim 20, wherein the first jetting head assembly and the second non-contact dispensing head assembly each forms part of two separate and/or different equipment devices.

* * * * *